(12) United States Patent
Nakamura

(10) Patent No.: US 8,110,748 B2
(45) Date of Patent: Feb. 7, 2012

(54) WIRING, DISPLAY DEVICE AND METHOD OF MANUFACTURING THE SAME

(75) Inventor: Hiroki Nakamura, Yokohama (JP)

(73) Assignee: Toshiba Mobile Display Co., Ltd., Fukaya-shi (JP)

( * ) Notice: Subject to any disclaimer, the term of this patent is extended or adjusted under 35 U.S.C. 154(b) by 0 days.

(21) Appl. No.: 12/614,246

(22) Filed: Nov. 6, 2009

(65) Prior Publication Data
US 2010/0044085 A1 Feb. 25, 2010

Related U.S. Application Data

(62) Division of application No. 10/800,861, filed on Mar. 16, 2004, now Pat. No. 7,626,125.

(30) Foreign Application Priority Data

Mar. 20, 2003 (JP) ................................ 2003-078113
Mar. 9, 2004 (JP) ................................ 2004-065613

(51) Int. Cl.
*H05K 1/09* (2006.01)
(52) U.S. Cl. ....................................... 174/257; 174/261
(58) Field of Classification Search .................. 174/256, 174/257, 261; 257/748, 751, 766
See application file for complete search history.

(56) References Cited

U.S. PATENT DOCUMENTS

| | | | |
|---|---|---|---|
| 6,388,201 B2 | 5/2002 | Yamato et al. | |
| 6,395,627 B1 | 5/2002 | Hoshino et al. | |
| 6,791,112 B2 * | 9/2004 | Yamazaki et al. | 257/59 |
| 7,547,627 B2 * | 6/2009 | Okamoto et al. | 438/622 |
| 2002/0007961 A1 | 1/2002 | Yamato et al. | |
| 2002/0030978 A1 | 3/2002 | Kato | |
| 2003/0008075 A1 * | 1/2003 | Ueno et al. | 427/304 |
| 2005/0156179 A1 * | 7/2005 | Yamagata | 257/79 |

FOREIGN PATENT DOCUMENTS

| | | |
|---|---|---|
| JP | 02-281629 | 11/1990 |
| JP | 5-109714 | 4/1993 |
| JP | 6-318592 | 11/1994 |
| JP | 09-230362 | 9/1997 |
| JP | 10-188817 | 7/1998 |
| JP | 11-135504 | 5/1999 |
| JP | 11-330652 | 11/1999 |

(Continued)

OTHER PUBLICATIONS

Office Action issued Mar. 29, 2011, in Japanese Patent Application No. 2004-065613 with English translation.

(Continued)

Primary Examiner — Yuriy Semenenko
(74) Attorney, Agent, or Firm — Oblon, Spivak, McClelland, Maier & Neustadt, L.L.P.

(57) ABSTRACT

The present invention provides a wiring, a display device, and a method of manufacturing the same. A first metal diffusion-preventing layer is formed on a substrate or on a circuit element formed on the substrate. Then, a metal wiring layer is selectively formed on the first metal diffusion-preventing layer by an electroless metal plating method or a metal electroplating method. Further, the undesired portion of the first metal diffusion-preventing layer is removed. Finally, a second metal diffusion-preventing layer is formed selectively by an electroless metal plating method in a manner to cover the metal wiring layer or both a seed layer and the metal wiring layer.

11 Claims, 8 Drawing Sheets

FOREIGN PATENT DOCUMENTS

| | | |
|---|---|---|
| JP | 2000-049229 | 2/2000 |
| JP | 2000-212754 | 8/2000 |
| JP | 2000-216397 | 8/2000 |
| JP | 2000-330134 | 11/2000 |
| JP | 2000-357671 | 12/2000 |
| JP | 2001-023986 | 1/2001 |
| JP | 2001-181854 | 7/2001 |
| JP | 2001-189295 | 7/2001 |
| JP | 2001-342593 | 12/2001 |
| JP | 2002-50647 | 2/2002 |
| JP | 2002-57345 | 2/2002 |
| JP | 2003-031586 | 1/2003 |
| JP | 2003-31588 | 1/2003 |
| KR | 1998-060600 | 10/1998 |
| KR | 1998-077339 | 11/1998 |
| KR | 2002-0037173 | 5/2002 |

OTHER PUBLICATIONS

Office Action issued Jan. 4, 2011, in Japanese Patent Application No. 2004-065613, filed Mar. 9, 2004 (with English-language Translation).

* cited by examiner

WIRING, DISPLAY DEVICE AND METHOD OF MANUFACTURING THE SAME

CROSS-REFERENCE TO RELATED APPLICATIONS

This application is a divisional of U.S. patent application Ser. No. 10/800,861, filed Mar. 16, 2004, and is based upon and claims the benefit of priority from prior Japanese Patent Applications No. 2003-078113, filed Mar. 20, 2003, and No. 2004-065613, filed Mar. 9, 2004. The entire contents of these applications are incorporated herein by reference.

BACKGROUND OF THE INVENTION

1. Field of the Invention

The present invention relates to a wiring, which is used in, for example, a display device represented by a liquid crystal display device or a semiconductor device such as a ULSI, and to the method of manufacturing the same.

2. Description of the Related Art

In general, a wiring and an electrode, which are formed of aluminum (Al) or an alloy thereof, are used mainly in a semiconductor device represented by an LSI or a ULSI. However, copper (Cu) has an electrical resistance lower than that of Al and a high resistance to the electromigration and the stress migration. Such being the situation, the use of copper as the material of the wiring and the electrode of the next era is being studied in accordance with, for example, the progress of the miniaturization and the improvement in the operating speed which have been brought about as a result of the improvement in the degree of integration achieved in recent years.

Further, in the field of display devices represented by, for example, a liquid crystal display device, the demands for the wiring having a low electrical resistance as in the field of the semiconductor device have been enhanced by, for example, the increase in the wiring length accompanying the enlargement of the display area, and by the development of a monolithic device having various functions such as a driver circuit and a memory within a pixel mounted thereto.

It was difficult to achieve a fine processing of copper for forming a wiring by a simple combination of a masking technology utilizing PEP (Photo Engraving Process), which is called photolithography, with an etching technology such as RIE (Reactive Ion Etching). To be more specific, a copper halide has a vapor pressure markedly lower than that of aluminum halide and, thus, the copper halide is unlikely to be evaporated. Therefore, various problems are generated in the case of employing an etching technology such as RIE. For example, it is necessary to carry out the etching process under an atmosphere of 200 to 300° C. Also, it is necessary to prepare a mask formed of $SiO_2$ or $SiN_x$ in place of the ordinary photoresist mask.

Such being the situation, it is possible to utilize a so-called "damascene process" disclosed in, for example, Japanese Patent Disclosure (Kokai) No. 2001-189295 and Japanese Patent Disclosure No. 11-135504. In the damascene process disclosed in these prior publications, a wiring groove having a desired wiring pattern is formed in advance in an insulator film formed on a substrate. Then, a thin copper layer is formed on the entire surface of the insulator film in a manner to fill the wiring groove by any of various methods such as a PVD (Physical Vapor Deposition) method utilizing a sputtering process, a metal plating method, and a CVD (Chemical Vapor Deposition) method utilizing an organometallic compound material. Further, a polishing process such as a CMP (Chemical Mechanical Polishing) process or an etch back process is applied to the thin copper layer until the insulator film positioned below the thin copper layer is exposed to the outside so as to form a wiring pattern formed of copper alone buried in the wiring groove.

However, the conventional technologies, including the technology disclosed in Japanese Patent Disclosure No. 2001-189295 and Japanese Patent Disclosure No. 11-135504 quoted above give rise to a serious problem, as pointed out below.

Specifically, the conventional damascene process quoted above requires at least a groove-forming step for forming a groove in which the wiring is buried, a film-forming step for forming a wiring pattern and a via (plug) for connecting the upper and lower electrodes, a photolithography step, an etching step, and a film-forming step for forming a polish-stopping film. It follows that the manufacturing process is rendered complex, which increases the manufacturing cost.

It should also be noted that, in order to lower the electrical resistance of the wiring, it is necessary to enlarge the cross sectional area of the wiring. However, in the case of employing a groove or a via hole having a large aspect ratio, i.e., having a small width or diameter and a large depth, in view of the limitation in the degree of integration, the burying nature of copper is lowered. Also, the CMP step included in the conventional damascene process, in which a thin copper film is formed on the entire surface of the substrate, followed by removing the undesired portion of the copper film, takes a log treating time so as to lower the throughput.

Further, a large CMP apparatus that permits processing a large semiconductor wafer having a diameter of 12 inches or more has been developed. However, a manufacturing apparatus has not yet been put to practical use when it comes to display devices using a glass substrate larger than the semiconductor wafer quoted above, and is not satisfactory in, for example, the surface flatness.

Also, in the case of a display device, e.g., a large substrate (display screen) mounted to a large liquid crystal display device, it is certainly possible to remove the undesired portion of the thin copper layer by the polishing of the entire surface utilizing the CMP process or by the etching. However, the area of the thin copper layer portion utilized as the wiring is very small, compared with the area of the glass substrate. In other words, most of the thin copper layer formed on the insulator film including the groove pattern is removed, and be discarded. It follows that the utilization efficiency of copper, which is a costly material, is very low, leading to a high manufacturing cost of the display device.

BRIEF SUMMARY OF THE INVENTION

An object of the present invention is to provide a wiring, a display device and the manufacturing method thereof, which make it possible to form a metal wiring made of a material having a low resistivity on a large substrate, to eliminate the waste of the wiring material in forming the wiring, and to lower the manufacturing cost by decreasing the number of manufacturing process steps.

According to a first aspect of the present invention which is intended to achieve the object pointed out above, there is provided a wiring and an electrode, comprising a first metal diffusion-preventing layer formed on a substrate, a metal seed layer formed on the first metal diffusion-preventing layer, a metal wiring layer formed on the metal seed layer, and a second metal diffusion-preventing layer covering the exposed surface including the side surface of the multilayered structure consisting of the metal seed layer and the metal wiring layer, wherein the metal seed layer and the metal wiring layer are surrounded by the first metal diffusion-preventing layer and the second metal diffusion-preventing layer.

According to a second aspect of the present invention, there is provided a display device using the wiring and the electrode defined above.

According to a third aspect of the present invention, there is provided a method of forming a wiring and an electrode, comprising forming a first metal diffusion-preventing layer on a substrate, forming a metal seed layer on the first metal diffusion-preventing layer, forming a metal wiring layer having a predetermined pattern on the metal seed layer, etching at least that region of the metal seed layer which is positioned outside the region that is bonded to the metal wiring layer, etching that region of the first metal diffusion-preventing layer which is positioned outside the region bonded to the metal seed layer, and forming a second metal diffusion-preventing layer in a manner to cover the exposed surface including the side surfaces of the metal wiring layer, the metal seed layer and the first metal diffusion-preventing layer.

Further, according to a fourth aspect of the present invention, there is provided a method of manufacturing a display device using the wiring and the electrode formed by the method defined above.

It is possible for another circuit element or a part of another circuit element to be interposed between the substrate and the first metal diffusion-preventing layer.

The wiring and the display device including the particular wiring, which are defined above, are manufactured by forming a pattern on the metal seed layer, followed by selectively forming a metal wiring layer by an electroless metal plating method or a metal electroplating method in accordance with the pattern and subsequently removing the undesired portion of the metal seed layer positioned outside the region bonded to the metal wiring layer. In the wiring and the display device thus manufactured, the diffusion of copper is prevented in the subsequent heat treating step that is carried out after the wiring is surrounded by the metal diffusion-preventing layer. In addition, the wiring can be formed selectively directly on the substrate or on the circuit element formed on the substrate without employing the CMP process.

The substrate is used as an underlayer on which the first metal diffusion-preventing layer is formed. Also, the display device of the present invention includes an active matrix type display device such as a liquid crystal display device or an EL display (Electroluminescence Display) device. Further, the wiring of the present invention includes not only the electrode, the data line and the scanning line of the driving elements (pixel TFTs) formed in the display region but also the wiring arranged in the peripheral region and the wiring within the peripheral driver circuit formed on the same substrate.

DETAILED DESCRIPTION OF THE INVENTION

Some embodiments of the present invention will now be described in detail with reference to the accompanying drawings.

Figure 1:
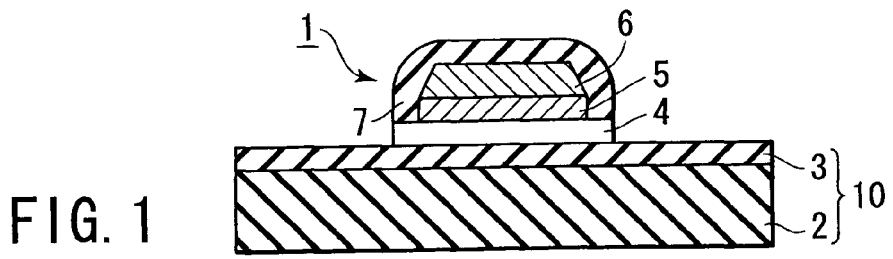
FIG. 1 is a cross sectional view showing the construction of a wiring according to a first embodiment of the present invention.

FIG. 1 is a cross sectional view showing the construction of a wiring and an electrode according to a first embodiment of the present invention. The example shown in FIG. 1 is directed to the case where the wiring is formed in direct contact with a substrate. Needless to say, however, it is possible for a circuit element or a part thereof to be formed on the substrate in advance. In this case, it is possible for the wiring or the electrode of the present invention to be formed on the circuit element or a part thereof formed on the substrate.

As shown in the drawing, an underlying insulator layer 3 is formed on a substrate 2 made of, for example, glass, and a wiring 1 of a four-layer structure is formed on the underlying insulator layer 3. Incidentally, the multilayered structure consisting of the substrate 2 and the underlying insulator layer 3 is called an insulating substrate 10. To be more specific, the wiring 1 comprises a first copper diffusion-preventing layer 4, i.e., a layer 4 for preventing copper diffusion, formed on the underlying insulator layer 3 along a wiring pattern, a copper seed layer 5 formed on the first copper diffusion-preventing layer 4 and having a width slightly smaller than that of the layer 4, a copper wiring layer 6 formed on the copper seed layer 5 and having a width slightly smaller than that of the layer 5, and a second copper diffusion-preventing layer 7, i.e., a layer 7 for preventing copper diffusion, formed in a manner to cover the surfaces of the copper seed layer 5 and the copper wiring layer 6. In the wiring 1 of the four-layer structure described above, the copper seed layer 5 and the copper wiring layer 6, which substantially form the copper wiring, are surrounded by the first copper diffusion-preventing layer 4 and the second copper diffusion-preventing layer 7. Where the wiring of the particular construction is incorporated in a circuit, it is possible for the adjacent circuit element such as TFTs from being affected by the diffusion of copper and, thus, the characteristics of the adjacent circuit element are prevented from being deteriorated. The electrode for this embodiment can be applied to, for example, the gate electrode or the source/drain electrodes having a low resistivity, which is included in amorphous silicon TFTs or polycrystalline silicon (polysilicon) TFTs.

The underlying insulator layer 3 has a thickness of, for example, 400 nm. Concerning the thickness of each layer included in the wiring 1, the first copper diffusion-preventing layer 4 has a thickness of, for example, 50 nm, the copper seed layer 5 has a thickness of, for example, 50 nm, the copper wiring layer 6 formed by a metal electroplating method has a thickness of, for example, 400 nm, and the second copper diffusion-preventing layer 7 formed by an electroless metal plating method has a thickness of, for example, 50 nm. Incidentally, each of the metal seed layer and the metal wiring layer included in the wiring of the present invention is formed of copper or a metallic material containing copper. In the example shown in FIG. 1, each of the metal seed layer and the metal wiring layer is formed of copper. However, it is also possible to use another metal such as silver or gold for forming the metal seed layer and the metal wiring layer.

A method of forming the wiring and the electrode according to the first embodiment of the present invention will now be described with reference to FIGS. 2A to 2D and 3A to 3D. The following description covers the case of forming the wiring.

In the forming method for this embodiment, the wiring 1 is formed by the combination of formation of the metal wiring layer by a selective electroless metal plating method utilizing a photosensitive resin mask, i.e., a so-called "photoresist mask", and the etching of the metal seed layer by, for example, a wet etching or an electrolytic etching. The predetermined pattern of the wiring 1 (wiring pattern) is determined by, for example, a photoresist mask, and the pattern is depicted by the portion where the underlayer is not exposed by the mask. The mask material is not limited to a photosensitive resin. It is possible to use an optional material as the mask material as long as the material can be removed and does not exert electrical and chemical functions to the underlayer and the wiring to be formed. This is also the case with the embodiment described below.

In the first step, an underlying insulator layer 3 consisting of a silicon nitride layer (SiN layer) is deposited in a thickness of, for example, 400 nm on the entire surface of a substrate 2 made of glass and having a thickness of, for example, 0.7 mm by a CVD method, e.g., a PE (Plasma-Enhanced)-CVD method. Then, a first copper diffusion-preventing layer 4 is formed on the underlying insulator layer 3 in a thickness of, for example, 50 nm by a sputtering method. Of course, the methods of forming the underlying insulator layer 3 and the first copper diffusion-preventing layer 4 are not particularly limited. It is also possible to employ other film-forming methods, such as a vapor deposition method.

It is possible for the first copper diffusion-preventing layer 4 to be formed of a Ta layer, a TaN layer, a TiN layer, a TaSiN layer, a WSiN layer, a Mo layer, a Co alloy (e.g., Co—B or Co—W—B) layer, a Ni alloy (e.g., Ni—B) layer, or a Mo alloy layer. It is also possible for the first copper diffusion-preventing layer 4 to be of a multilayered structure of Ta/TaN/Ta, TiN/Ti, Co—B/Co, or Ni—B/Ni, which has a high adhesion to the underlying insulator film 3, has a low resistance, and performs a vital function of preventing the copper diffusion, in place of a single layer structure. Incidentally, it is possible to use a multilayered film as a copper diffusion-preventing layer in each of the embodiments described in the following. Also, it is possible to use a quartz glass, a ceramic material or a resin material as well as the ordinary glass for forming the substrate 2. Of course, the technical idea of the present invention can also be applied to a semiconductor wafer.

Figure 2A:
FIGS. 2A, 2B, 2C and 2D are cross sectional views collectively showing the former part of a method of forming a wiring according to the first embodiment of the present invention.
Figure 2B:
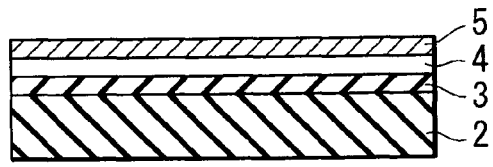
Figure 2C:
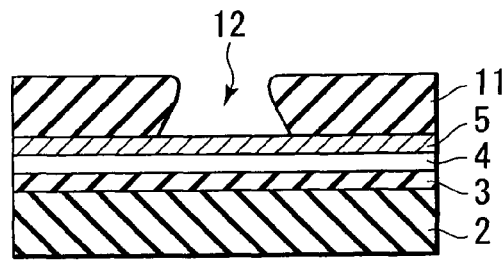

In the next step, a seed layer 5 made of copper is formed on the first copper diffusion-preventing layer 4 by, for example, a sputtering method to a thickness of, for example, 50 nm, as shown in FIG. 2B. The copper seed layer 5 is formed for forming a copper wiring layer 6 by a metal plating method. Then, a photoresist layer (photosensitive resin layer) 11 is formed on the copper seed layer 5 by utilizing PEP as shown in FIG. 2C. Further, a groove 12, which is tapered reverse such that the bottom side is broader than the open side, is formed in the photoresist layer 11 in preparation for the formation of a copper wiring layer that is tapered forward.

To be more specific, it is possible for the copper wiring layer formed in the subsequent step to have a rectangular cross sectional shape. However, it is desirable for the copper wiring layer to have a cross sectional shape that is tapered forward in view of the coverage of an interlayer insulator film that is laminated after formation of the wiring and the effect of suppressing the short-circuit with the wiring formed in the upper layer. Such being the situation, it is desirable for the groove 12 to be tapered reverse. The groove that is tapered reverse can be formed by appropriately controlling the resist material, the light exposure conditions and the developing conditions.

Figure 2D:
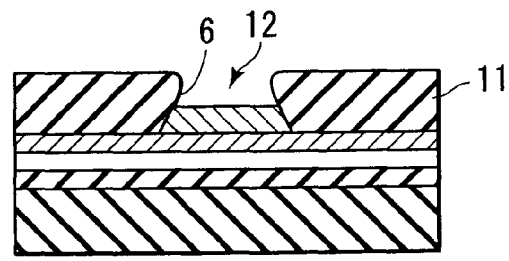

In the next step, a copper wiring layer 6 is formed by an electroless metal plating method on the copper seed layer 5 exposed to the outside within the groove 12 formed in the photoresist layer 11, as shown in FIG. 2D. Incidentally, the copper wiring layer 6 can also be formed similarly by employing an electroplating method in place of the electroless plating method. In the case of employing the electroless metal plating method, it is unnecessary to employ a catalyzation process for depositing the copper wiring layer 6 on the copper seed layer 5. Also, it is possible to suppress the non-uniformity in the thickness distribution, which poses a problem when a metal layer is formed on a substrate having a large surface area.

Figure 3A:
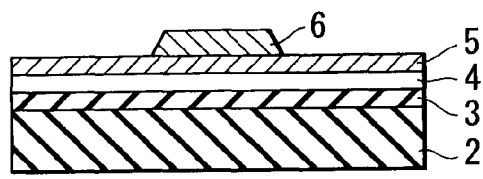
FIGS. 3A, 3B, 3C and 3D are cross sectional views collectively showing the latter part of the method of forming a wiring according to the first embodiment of the present invention.

Then, the photoresist layer 11 is removed by using, for example, a photoresist remover as shown in FIG. 3A. In removing the photoresist layer 11, it is also possible to employ an ashing process, which is a dry process, in combination with the process with the photoresist remover. Incidentally, where the photoresist ashing process is carried out, it is possible for the exposed surfaces of the copper wiring layer 6 and the copper seed layer 5 to be oxidized. Therefore, it is desirable to carry out the process of removing the copper oxide film immediately after the ashing treatment.

Figure 3B:
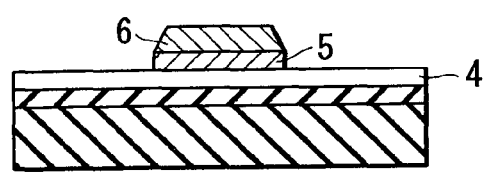

In the next step, the copper layers (the copper seed layer 5 and the copper wiring layer 6) formed on the first copper diffusion-preventing layer 3 are etched so as to remove at least the copper seed layer 5, as shown in FIG. 3B. It is desirable to employ a wet etching process or an electrolytic etching process in this etching step.

It is possible to use, for example, a iron chloride series etching solution, copper chloride-hydrochloric acid series etching solution, a phosphoric acid-acetic acid-nitric acid series etching solution, a hydrofluoric acid-ammonium persulfate-hydrochloric acid series etching solution, a sulfuric acid-hydrogen peroxide series etching solution or a peroxosulfate salt-hydrofluoric acid series etching solution as the wet etching solution for removing the copper seed layer 5. Incidentally, where the thick copper wiring layer 6 is subjected to a wet etching process by using a resist mask, the side-etching problem is generated in the edge portion of the pattern because the wet etching is generally isotropic. However, where the seed layer 5 is sufficiently thin, the seed layer 5 is also etched in the etching process of the metal wiring layer 6 and, thus, the side-etching is scarcely generated.

Incidentally, in the etching stage of the copper seed layer 5, the copper wiring layer 6 is also etched simultaneously. Such being the situation, the copper wiring layer 6 is formed thick in advance in the process step shown in FIG. 2D in view of the thickness of the copper wiring layer 6 that is etched in this stage. In this embodiment, the copper seed layer is used as the metal seed layer. Needless to say, however, it is also possible to use a seed layer of the VIIIa group metal such as a nickel or a cobalt in place of the copper seed layer as far as the copper wiring layer 6 can be formed in direct contact with the VIIIa group metal seed layer. Also, the use of a nickel seed layer is advantageous in that the nickel seed layer can be etched with a nitric acid-sulfuric acid-hydrogen peroxide-ammonium chloride series etching solution while scarcely etching the copper wiring layer 6. Needless to say, it is also possible to use a nickel layer as an adhesion layer and to form a copper seed layer on the nickel layer.

In the case of employing an electrolytic etching process in addition to the wet etching process, the copper layers (the copper seed layer 5 and the copper wiring layer 6) formed on the first copper diffusion-preventing layer are etched by applying a prescribed voltage between the first copper diffusion-preventing film used as an anode and a cathode plate (cathode). The electrolytic etching is featured in that the etching selectivity of the copper diffusion-preventing layer 3, the copper seed layer 5 and the copper wiring layer 6 can be controlled easily, and that the etching rate is relatively high. It is desirable to set the voltage applied for carrying out the electrolytic etching at, for example, about 10V at which the first copper diffusion-preventing layer 3 is not electrolytically etched, though the electrolytic etching is generated in the copper layer. It is possible to use an acid such as sulfuric acid, phosphoric acid or hydrochloric acid as the base bath for the etching, though the base bath is not limited to the acid exemplified above. Of course, it is possible to use an additive for controlling the etching rate ratio of the copper seed layer 5 and the copper wiring layer 6 to the first copper diffusion-preventing layer 3 and for controlling the tapered shape of the copper wiring layer 6. In addition, it is possible to control the base bath temperature and the waveform of the applied current.

Figure 3C:
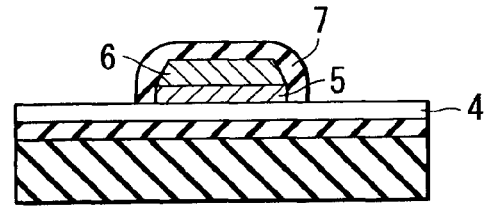

In the next step, a second copper diffusion-preventing layer 7 made of, for example, Co—W—B is formed by, for example, an electroless metal plating method in a thickness of, for example, 50 nm in a manner to cover the entire exposed surfaces of the copper wiring layer 6 and the copper seed layer 5, as shown in FIG. 3C. Since the second copper diffusion-preventing layer 7 is formed on the copper wiring layer 6 by the electroless metal plating method, a material adapted for the metal plating is selected for forming the second copper diffusion-preventing layer 7. For example, it is desirable for the second copper diffusion-preventing layer 7 to be formed of Co—W—B that permits eliminating the treatment with a Pd catalyzation in the case of using dimethyl amine borane as a reducing agent. To be more specific, it is desirable to form the second copper diffusion-preventing layer 7 made of the particular material by an electroless metal plating method. Alternatively, it is also possible for the second copper diffusion-preventing layer 7 to be formed of, for example, Co—B, Co—P, Co—W—B, Ni—B, Ni—P, or Ni—W—P because a layer of the particular material can be selectively formed on the surface of a copper layer by means of an electroless metal plating process.

Figure 3D:
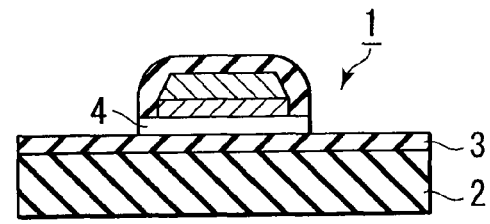

Finally, an etching process is applied with the portion of the copper wiring layer which is covered with the second copper diffusion-preventing layer 7 used as a self-aligned etching mask, so as to remove the first copper diffusion-preventing layer 4 except the portion positioned below the copper wiring, as shown in FIG. 3D.

As described above, in the first embodiment of the present invention, it is unnecessary to employ the step for forming a polish stopping film for the CMP process, which is required in the conventional damascene process described previously, before formation of the copper diffusion-preventing layer. It is also unnecessary to employ the etching step for forming a groove in which the copper wiring is to be buried. Also, a polishing agent (slurry) is used in the CMP process employed in the damascene method, which makes it necessary to wash the polishing agent and the polished material including metal ions. However, the washing process is also unnecessary in the first embodiment of the present invention. What should also be noted is that it is possible to suppress the cause of the mixing of foreign materials in the polishing stage included in the CMP process.

The first embodiment of the present invention therefore makes it possible to form a metal wiring of a high reliability, which is surrounded by the metal diffusion-preventing layer, and to decrease the number of process steps compared with the damascene process, which lowers the manufacturing cost. Further, the first embodiment of the present invention can also be applied easily to a substrate having a large surface area, though it is difficult to apply the CMP process required in the damascene process to a large substrate. In the first embodiment described above, copper is exemplified as the wiring material. However, the wiring material is of course not limited to copper. It is also possible to use, for example, a copper-containing alloy and other metals such as gold and silver, which can be formed into a film by a metal plating method.

A wiring and an electrode according to a second embodiment of the present invention will now be described.

The wiring and the electrode for the second embodiment also include a seed layer like the construction of the wiring and the electrode for the first embodiment shown in FIG. 1. However, the second embodiment differs from the first embodiment in the method of forming the seed layer. In the following description of the second embodiment, the constituting members and the manufacturing steps equal to those for the first embodiment shown in FIGS. 1 to 3D are denoted by the same reference numerals, so the detailed description thereof is omitted. Also, the thickness of each of the films constituting the wiring is equal to that in the first embodiment. The second embodiment is directed to the construction in which the wiring is formed in direct contact with the substrate. However, it is of course possible to form the wiring or the electrode on a circuit element or a part thereof formed in direct contact with the substrate.

A first method of forming a wiring (electrode) according to the second embodiment of the present invention will now be described with reference to FIGS. 4A to 4D and 5A to 5C.

Figure 4A:
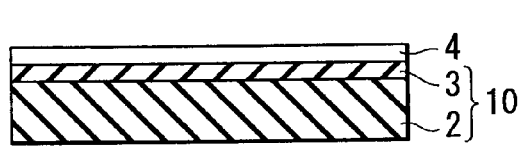
FIGS. 4A, 4B, 4C and 4D are cross sectional views collectively showing the former part of a method of forming a wiring according to a second embodiment of the present invention.

The process step shown in FIG. 4A is equal to that shown in FIG. 2A. To reiterate, an underlying insulator layer 3 consisting of a silicon nitride layer (SiN layer) is deposited first on the entire surface of a substrate 2, followed by forming a first copper diffusion-preventing layer 4 on the underlying insulator layer 3 by a sputtering method, as shown in FIG. 4A. Of course, the methods of forming these layers 3 and 4 are not limited to the depositing method and the sputtering method quoted above. It is also possible to employ other film-forming methods, such as a vapor deposition method. Also, it is possible to use, for example, a Ta layer, a TaN layer, a WN layer, a TaSiN layer, a WSiN layer, a Co alloy layer or a Ni alloy layer as the first copper diffusion-preventing layer 4. Incidentally, the multilayered structure consisting of the substrate 2 and the underlying insulator layer 3 is called an insulating substrate 10.

Figure 4B:
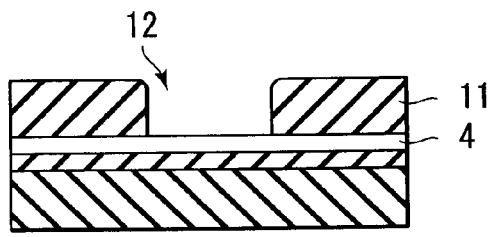

The process step shown in FIG. 4B is equal to that shown in FIG. 2C. To reiterate, a photoresist layer 11 is formed on the insulating substrate 10. Also, a groove 12 having a rectangular cross sectional shape (vertical side wall) is formed in the photoresist layer 11 as shown in FIG. 4B. Of course, it is possible for the cross sectional shape of the groove 12 to be tapered reverse as described previously.

Figure 4C:
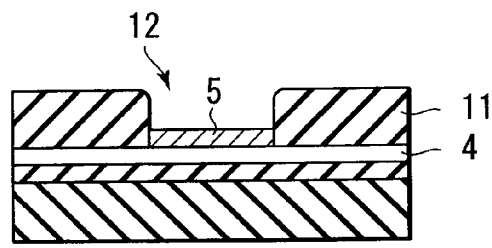
Figure 5C:
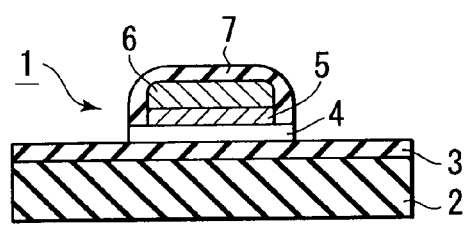

In the process step shown in FIG. 4C, an copper oxide film such as a native oxide film formed on the surface of the first copper diffusion-preventing layer 4 exposed to the outside at the bottom portion of the groove is removed, followed by forming a copper seed layer 5 by an electroless metal plating method on the first copper diffusion-preventing layer 4 within the groove 12.

Figure 4D:
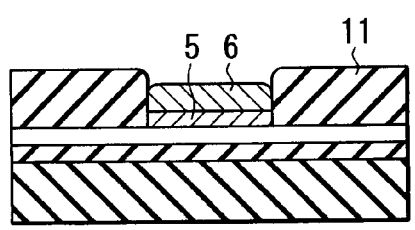

In the process step shown in FIG. 4D, a copper wiring layer 6 is formed selectively on the copper seed layer 5 within the groove by an electroplating method with the copper seed layer 5 and the first copper diffusion-preventing layer 4 used as electrodes. Of course, it is possible to continue the electroless metal plating method without using the electroplating method.

Figure 5A:
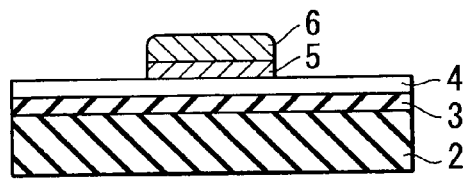
FIGS. 5A, 5B and 5C are cross sectional views collectively showing the latter part of the method of forming a wiring according to the second embodiment of the present invention.

In the next step, the photoresist layer 11 is removed by using, for example, a photoresist remover as shown in FIG. 5A. In removing the photoresist layer 11, it is also possible to employ a photoresist ashing process in combination with the process using the photoresist remover as described previously. In this case, however, it is necessary to employ an additional step of removing an copper oxide film.

Figure 5B:
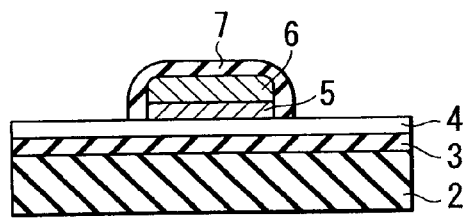

The process step shown in FIG. 5B is equal to that shown in FIG. 3C. To reiterate, a second copper diffusion-preventing layer 7 made of, for example, Co—W—B is formed by an electroless metal plating method in a manner to cover the entire exposed surfaces of the copper wiring layer 6 and the copper seed layer 5, i.e., the entire circumferential surface excluding the bonding surface with the first copper diffusion-preventing layer 4, as shown in FIG. 5B. Further, in the process step shown in FIG. 5C, an etching process is carried out with that portion of the copper wiring layer which is covered with the second copper diffusion-preventing layer 7 allowed to perform the function of a self-aligned mask so as to remove the first copper diffusion-preventing layer 4 except the portion positioned below the copper wiring.

A second film-forming method, which is a modification of the second embodiment, will now be described.

In the process step shown in FIG. 4C, the copper seed layer is formed by an electroless metal plating method, followed by forming the copper wiring layer 6 in the step shown in FIG. 4D by a metal electroplating method with the copper seed layer and the first copper diffusion-preventing layer 4 used as an electrode. Alternatively, it is also possible to form a very thin copper seed layer 5 on the first copper diffusion-preventing layer 4 by a displacement plating method in place of the electroless metal plating method. The displacement plating process is carried out by using a solution for removing the oxide film on the surface of the first copper diffusion-preventing layer 4 exposed to the outside at the bottom portion within the groove formed in the photoresist layer, i.e., a solution containing, for example, copper ions, hydrofluoric acid and ammonium fluoride or nitric acid. Also, it is possible for the copper seed layer 5 to be the formation of copper nuclei that permit application of the electroless metal plating process in the subsequent step.

A third film-forming method, which is another modification of the second embodiment, will now be described.

In the process step shown in FIG. 4C, the copper seed layer 5 is formed by the displacement plating method. However, it is also possible to employ a CVD method using an organometallic compound material for forming the copper seed layer 5. The organometallic compound containing copper, which can be used in the present invention, includes, for example, a monovalent copper complex compound of copper (hexafluoroacetonate)trimethylvinylsilane (Cu(hfac) TMVS). If the copper seed layer 5 is formed under a low temperature of about, for example, 140° C. by using the organometallic compound exemplified above, it is possible to achieve the selectivity of the film formation in the initial stage of the film formation between a region on the conductive material such as the copper diffusion-preventing layer and a region on the insulating material such as the photoresist or an oxide film. To be more specific, the thickness of the film is proportional to the film-forming time in the region on the conductive material. On the other hand, a latent period during which the film is not formed in the initial period of the film formation is generated in the region on the insulating material. As a result, the thickness of the film is not proportional to the film-forming time. It follows that the selectivity of the film formation is brought about. It should be noted, however, that, after a copper layer is formed by the nucleus growth on the insulating material, i.e., after the latent period, e.g., about 2 to 60 minutes, the film is formed on the insulating material at the film-forming rate substantially equal to that on the conductive material. Such being the situation, it is desirable to form selectively the copper seed layer during the latent period during which the progress of the nucleus growth on the insulating material is low.

The second embodiment also permits producing the function and effect substantially equal to those produced in the first embodiment described previously. In addition, it is possible to form selectively the copper seed layer and the copper wiring layer in the desired regions in the second embodiment of the present invention so as to make it possible to omit the etching process step in the copper seed layer. It follows that the manufacturing cost can be further lowered.

A wiring and an electrode according to a third embodiment of the present invention will now be described.

Figure 6:
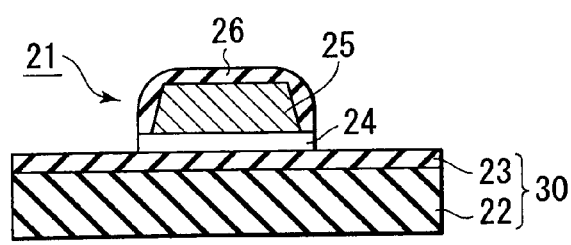
FIG. 6 is a cross sectional view showing the construction of a wiring according to a third embodiment of the present invention.

FIG. 6 is a cross sectional view showing the wiring and the electrode according to the third embodiment of the present invention. The wiring and the electrode for the third embodiment are equal to those for the first embodiment, except that the copper seed layer included in the first embodiment is not included in the third embodiment. The following description covers the case where a wiring 21 is formed in direct contact with the substrate. Needless to say, however, it is possible for a circuit element or a part thereof to be formed on the substrate in advance. In this case, it is possible for the wiring or the electrode to be formed on the circuit element or a part thereof formed on the substrate.

In the wiring 21 shown in FIG. 6, an underlying insulator layer 23 is formed on a substrate 22 made of, for example, glass. As shown in the drawing, a first copper diffusion-preventing layer 24 extending along the wiring pattern is formed on the underlying insulator layer 23, and a copper wiring layer 25 having a width slightly smaller than that of the first copper diffusion-preventing layer 24 is laminated on the first copper diffusion-preventing layer 24. Then, a second copper diffusion-preventing layer 26 is formed to cover the entire surface of the copper wiring layer 25.

The wiring 21 of this construction is of a three-layer structure in which the copper wiring layer 25 is surrounded by the first copper diffusion-preventing layer 24 and the second copper diffusion-preventing layer 26. It follows that, when the wiring 21 is incorporated in a circuit, it is possible to prevent other circuit elements from being affected by the copper diffusion. For example, it is possible to prevent the characteristics of a TFT from being deteriorated. The electrode for this embodiment can be applied to, for example, the gate electrode or the source/drain electrodes having a low resistance, which is included in amorphous silicon TFTs or polysilicon TFTs.

The underlying insulator layer 23 has a thickness of, for example, 400 nm. Concerning the thickness of each layer included in the wiring 21, the first copper diffusion-preventing layer 24 has a thickness of, for example, 50 nm, the copper wiring layer 25 has a thickness of, for example, 400 nm, and the second copper diffusion-preventing layer 26 has a thickness of, for example, 50 nm.

The method of forming the wiring 21 for the third embodiment will now be described in detail with reference to FIGS. 7A to 7D and 8A to 8C.

In the third embodiment of the present invention, a metal wiring layer is selectively formed on the first copper diffusion-preventing layer by an electroless metal plating method with a photosensitive resin or an inorganic insulator layer used as a mask, followed by forming a second copper diffusion-preventing layer in a manner to cover the metal wiring layer.

Figure 7A:
FIGS. 7A, 7B, 7C and 7D are cross sectional views collectively showing the former part of a method of forming a wiring according to the third embodiment of the present invention.
Figure 7B:
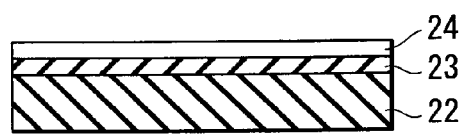

In the first step, the underlying insulator layer 23 consisting of a silicon nitride layer (SiN layer) is deposited on the entire surface of the substrate 22 by a PE (Plasma-Enhanced)-CVD method as shown in FIG. 7A, followed by forming the first copper diffusion-preventing layer 24 by a sputtering method as shown in FIG. 7B. It is possible for the first copper diffusion-preventing layer 24 to be formed of a Ta layer, a TaN layer, a TiN layer, a TaSiN layer, a WSiN layer, a Co alloy layer, or a Ni alloy layer. Incidentally, the multilayered structure consisting of the substrate 22 and the underlying insulator layer 23 is called an insulating substrate 30.

Figure 7C:
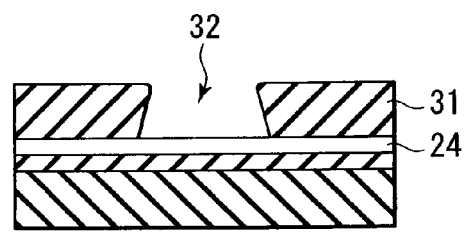

In the process step shown in FIG. 7C, a photoresist layer 31 is formed on the first copper diffusion-preventing layer 24 by PEP. A groove 32 that is oppositely tapered is formed in the photoresist layer 31. It is possible for the groove 32 to be defined by vertical walls. However, it is desirable for the groove 32 to be oppositely tapered because it is desirable for the metal wiring layer formed within the groove 32 to be tapered forward in view of the coverage of the interlayer insulator film forming the upper layer and in view of the effect of suppressing the short-circuit with the upper layer wiring, as described previously.

Figure 7D:
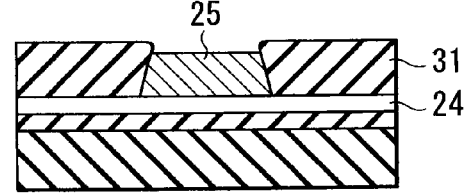

In the process step shown in FIG. 7D, the copper wiring layer 25 is formed by an electroless metal plating method in the bottom portion of the groove 32 formed in the photoresist layer 31. Where a metal layer is formed directly on the first copper diffusion-preventing layer 24 by the electroless metal plating method, a process with a Pd catalyzation is performed in general. However, it is desirable to avoid the problem that Pd is diffused within the copper wiring during the heat process performed in the subsequent step so as to lower the resistivity. Under the circumstances, it is desirable to apply an electroless metal plating process in place of the process with the Pd catalyzation after the process to remove the oxide film from the surface of the first copper diffusion-preventing layer. It is advisable to use a solution containing hydrofluoric acid for the process to remove the oxide film from the surface of the first copper diffusion-preventing layer. It is also possible to form the copper wiring layer 25 by the electroless metal plating method after formation of a thin copper seed layer or copper nuclei by allowing a solution containing hydrofluoric acid and ammonium fluoride or nitric acid to contain copper ions. Of course, in the case of using a Co alloy (e.g., Co—B, Co—W—B or C—B/Co) or a Ni alloy (e.g., Ni—B or Ni—B/Ni) for forming the first copper diffusion-preventing layer 24, it is possible to form the copper wiring layer 25 directly on the first copper diffusion-preventing layer 24 by the metal electroplating method.

Figure 8A:
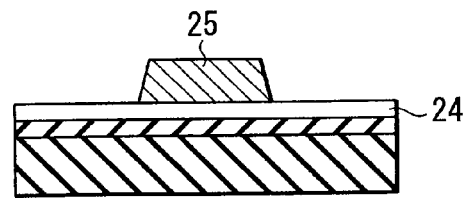
FIGS. 8A, 8B and 8C are cross sectional views collectively showing the latter part of the method of forming a wiring according to the third embodiment of the present invention.

In the process step shown in FIG. 8A, the photoresist layer 31 is removed by using, for example, a photoresist remover. In removing the photoresist film 31, it is also possible to employ an photoresist ashing process in combination with the process using the photoresist remover.

Figure 8B:
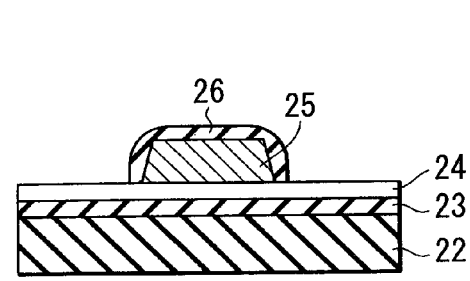

In the process step shown in FIG. 8B, the second copper diffusion-preventing layer 26 consisting of, for example, Co—W—B or Co—B is formed by an electroless metal plating method in a manner to cover the entire exposed surface of the copper wiring layer 25. In this step, it is desirable to form the copper diffusion-preventing layer consisting of, for example, Co—W—B or Co—B, which permits omitting the Pd catalyzation process, by an electroless metal plating method. For forming the second copper diffusion-preventing layer 26, it is advisable to use a material that permits selectively forming the copper wiring layer by the metal electroplating method.

Figure 8C:
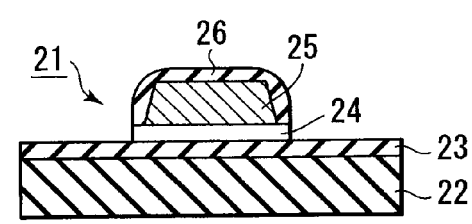

Finally, in the process step shown in FIG. 8C, the exposed region of the first copper diffusion-preventing layer 24 other than the portion positioned below the copper wiring layer is removed by an etching process with the second copper diffusion-preventing layer 26 covering the copper wiring portion used as a mask so as to form the wiring 21. Where a Co alloy (e.g., Co—B, Co—W—B or C—B/Co) or a Ni alloy (e.g., Ni—B or Ni—B/Ni) is used for forming the first copper diffusion-preventing layer 24, it is advisable to form the second copper diffusion-preventing layer 26 after the first copper diffusion-preventing layer 24 other than the portion positioned below the copper wiring layer 25 is etched with the copper wiring layer used as a mask, as shown in FIG. 13C.

For preparing an electroless metal plating bath used for forming the copper wiring layer 25, it is possible to use formaldehyde as the reducing agent. However, formaldehyde is harmful to the human body. In addition, the metal plating is carried out under a pH value of 12 to 13. It is therefore not desirable to use an alkali metal such as sodium in view of the application of the metal plating to the TFT process utilizing sodium hydroxide as the pH adjusting (pH-adjusting) agent. Under the circumstances, it is desirable to use a glyoxalic acid bath, in which glyoxalic acid is used as a reducing agent, and an organic alkali material such as TMAH (Tetramethyl ammonium hydroxide) is used as a pH control agent; a cobalt salt bath or a tin salt bath, in which a cobalt salt or a tin salt is used as a reducing agent; that does not contain a harmful substance or use an alkali metal.

However, since the organic alkali compound (e.g., TMAH) used as a pH control agent in the glyoxalic acid bath dissolves the photoresist mask, it is desirable to use a mask formed of a photosensitive resin resistant to the organic alkali compound, or a mask formed of an inorganic insulator film, such as a silicon nitride film or a silicon oxide film. The cobalt salt bath using a cobalt salt as a reducing agent is less likely to damage the photoresist mask because the metal plating using the cobalt salt bath is carried out under a neutral pH region, i.e., the pH value of 6 to 7. It follows that it is desirable to use the cobalt salt bath as an electroless metal plating bath optimum for the TFT process. In the electroless metal plating reaction process in the case of using the formaldehyde bath or the glyoxalic acid bath, the reducing agent is decomposed, hydrogen is generating. However hydrogen is not generating in the case of using the cobalt salt bath or the tin salt bath. It follows that the cobalt salt bath and the tin salt bath can be used as an electroless metal plating bath capable of forming a film having a good surface and also capable of suppressing the void generation.

is not shown). The wiring of the present invention can be used for forming a plurality of data lines and plurality of scanning lines formed on an array substrate. In addition, the wiring can be used for forming the gate electrodes and the source/drain electrodes included in a large number of TFTs arranged to form a matrix.

A first application of the wiring structure of the present invention to a polysilicon TFT will now be described. FIGS. 10A to 10D and 11A to 11C are cross sectional views collectively showing how to form a p-type TFT of a MOS structure in which the metal (copper) wiring layer of the present invention is used forming the gate electrode and the source/drain electrodes.

Figure 10A:
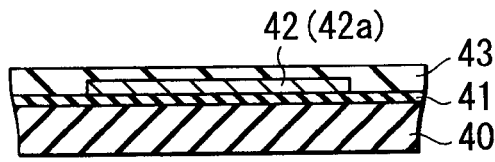
FIGS. 10A, 10B, 10C and 10D are cross sectional views collectively showing the former part of a method of forming a p-type TFT of the MOS structure, which provides a first example to which the wiring structure of the present invention can be applied.

In the first step, an underlying insulator layer 41 is deposited on a substrate 40, followed by depositing an amorphous silicon layer 42 used as an active layer on the underlying insulator layer 41, as shown in FIG. 10A. Further, an annealing treatment is applied under an atmosphere of 500° C. so as to release hydrogen within the amorphous silicon layer 42.

Then, the amorphous silicon layer 42 is crystallized by an ELA (Excimer Laser Anneal) method so as to form a polysilicon layer 42a and, after formation of a resist mask by PEP,

TABLE 1

|  | Formaldehyde bath | Glyoxylic acid bath | Cobalt salt bath | Tin salt bath |
| --- | --- | --- | --- | --- |
| Copper | Copper sulfate | Copper sulfate | Copper sulfate or copper nitrate | Copper sulfate |
| Reducing agent | Formaldehyde | Glyoxylic acid | Cobalt sulfate or cobalt nitrate | Tin sulfate |
| Complexing agent | Potassium sodium (+)-tartrate tetrahydrate or EDTA | EDTA | Ethylenediamine | Ethlendiamine |
| pH adjusting agent | Sodium hydroxide | TMAH | Sulfuric acid or nitric acid | Sulfuric acid |
| pH range | 12 to 13 | 12 to 13 | 6 to 7 | 4 to 5 |
| Additives | Cyanide Surfactant | 2,2'-Bipyridyl Surfactant | 2,2'-Bipyridly Ascorbic acid Hydrochloric acid | Citric acid Ascorbic acid Hydrochloric acid |
| Generated gas | Hydrogen gas | Hydrogen gas | None | None |

In the third embodiment described above, it is possible to obtain the function and effect similar to those obtained in the first embodiment described previously. To reiterate, it is possible to form a wiring by using copper as the material of the wiring layer and without employing the CMP process so as to decrease the number of manufacturing process steps compared with the prior art and, thus, to lower the manufacturing cost.

Of course, the third embodiment is not limited to the example described above and can be modified in various fashions within the technical scope of the present invention. For example, copper is used as the material of the wiring in the example described above. However, it is possible to use an alloy containing copper and other metals as the materials of the wiring without difficulty.

The wiring and the electrode according to any of the first to third embodiments described above can be applied to display devices such as active matrix liquid crystal display devices (LCDs). Of course, the wiring and the electrode according to the embodiment of the present invention can be applied not only to the LCDs but also to inorganic ELDs and organic ELDs.

Figure 9:
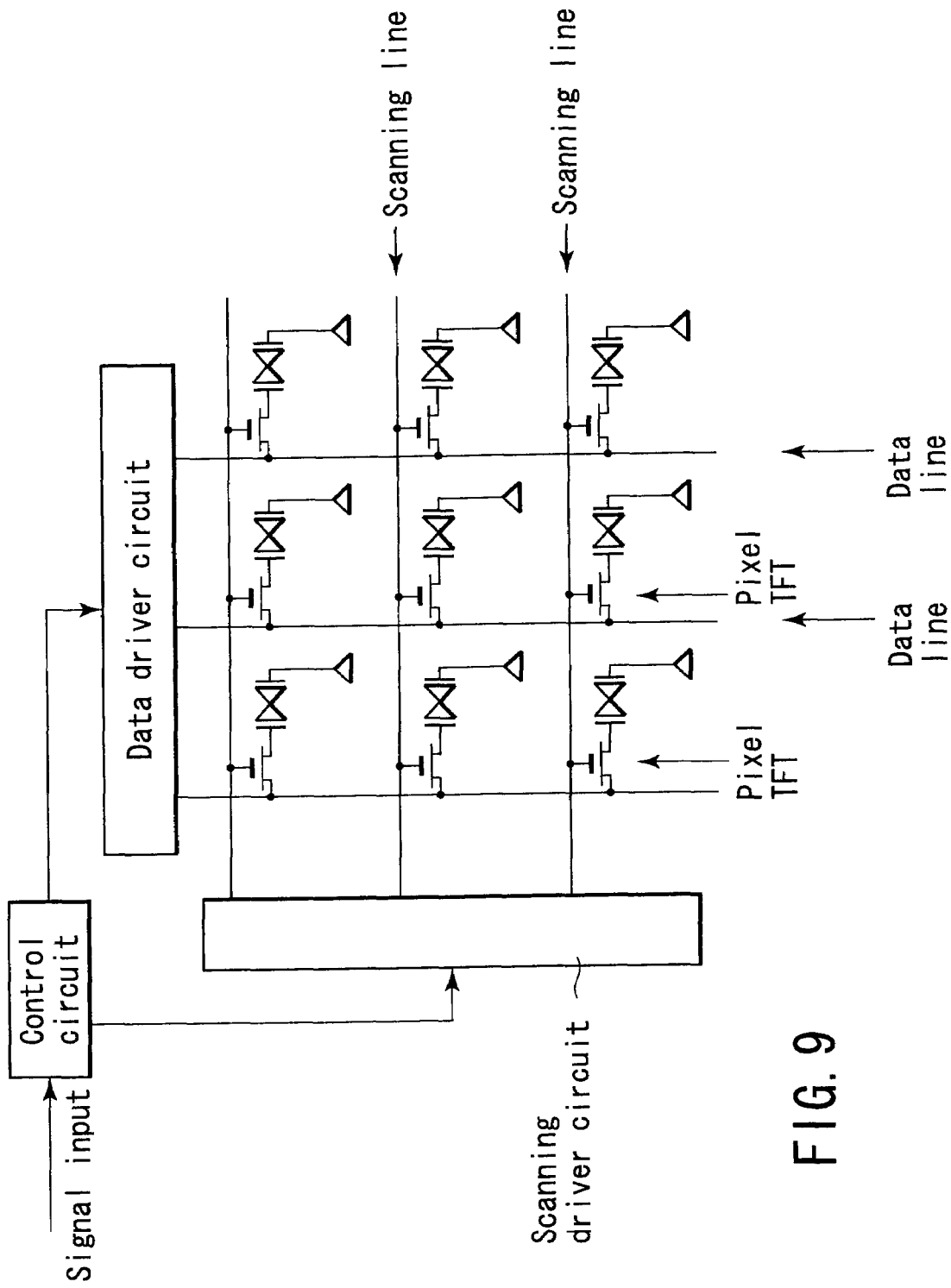
FIG. 9 exemplifies the equivalent circuit diagram of an active matrix LCD to which the wiring structure of the present invention can be applied.

FIG. 9 exemplifies an equivalent circuit diagram of the general active matrix LCDs (in which the storage capacitance the polysilicon layer 42a is processed into the shape of an island by a CDE (Chemical Dry Etching) method. Further, a gate insulator film 43 is deposited on the entire surface by a PE-CVD method. It is possible to use a silicon oxide single layer as the gate insulator layer. However, it is desirable for the gate insulator layer to be of a multilayered structure including an insulator layer such as a silicon nitride layer inhibiting the copper diffusion.

Figure 10B:
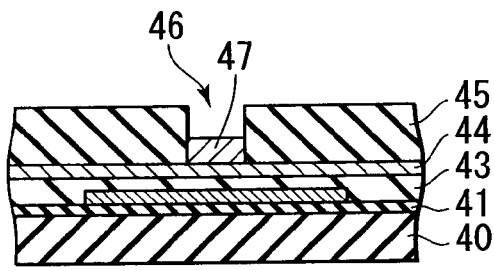

In the process step shown in FIG. 10B, a first copper diffusion-preventing layer 44 is formed by the method employed in any of the embodiments described above, followed by forming a photoresist layer (mask) 45 on the first copper diffusion-preventing layer 44 by PEP. Further, a copper wiring layer 47 is selectively formed in a groove 46 formed in the photoresist layer 45 by an electroless metal plating method or an metal electroplating method. Incidentally, in the case of employing the metal electroplating method, a seed layer is formed in advance as in each of the first and second embodiments described previously.

Figure 10C:
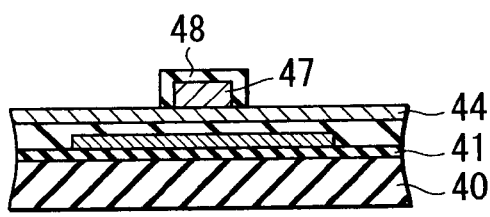

In the process step shown in FIG. 10C, the photoresist layer 45 is removed, followed by forming a second copper diffusion-preventing layer 48 by an electroless metal plating method in a manner to cover the entire surface of the copper wiring layer 47.

Figure 10D:
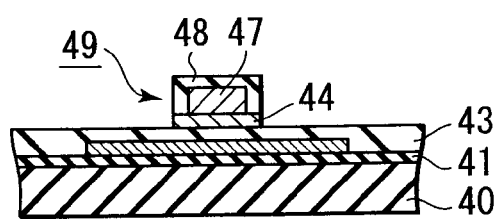

In the process step shown in FIG. 10D, the undesired portion of the first copper diffusion-preventing layer 44 is etched with the second copper diffusion-preventing layer 48 used as a mask so as to form a gate electrode 49.

Figure 11A:
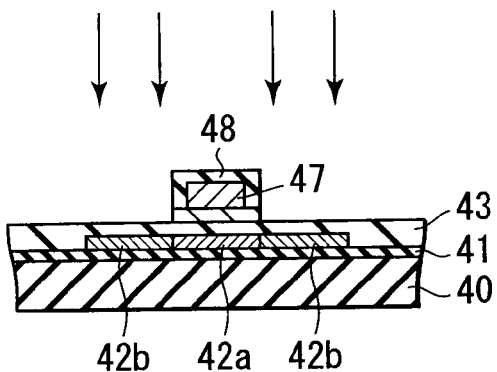
FIGS. 11A, 11B and 11C are cross sectional views collectively showing the latter part of a method of forming a p-type TFT of the MOS structure to which the wiring of the present invention can be applied.

In the process step shown in FIG. 11A, impurity regions (source/drain regions) 42b are formed by introducing boron into the polysilicon layer 42a by the ion implantation method with the copper wiring layer 47 surrounded by the second copper diffusion-preventing layer 48 used as a mask.

Figure 11B:
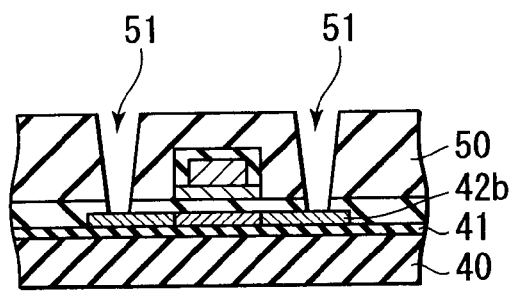

In the process step shown in FIG. 11B, an interlayer insulator film 50 is formed by a PE-CVD method. Of course, it is possible for the interlayer insulator film to be formed of a silicon oxide single layer. However, it is desirable for the interlayer insulator film to be of a multilayered structure including an insulator layer such as a silicon nitride layer inhibiting the copper diffusion. Further, a mask (not shown) consisting of a photoresist layer is formed by PEP on the interlayer insulator film 50, followed by etching the interlayer insulator film 50 so as to form contact holes 51 extending to reach the surfaces of the source/drain regions 42b.

Figure 11C:
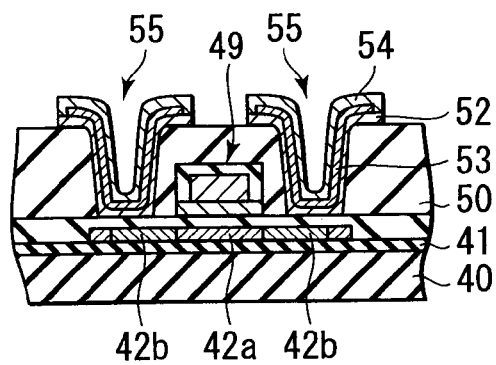

Further, in the process step shown in FIG. 11C, a third metal diffusion-preventing layer 52, i.e., a layer 52 for preventing the metal diffusion, is formed as in the third embodiment after formation of the contact hole 51 in the interlayer insulator film 50, followed by forming a mask by using a photoresist layer and subsequently forming selectively a copper wiring layer 53 in the groove portion of the photoresist layer by an electroless metal plating method. Further, a fourth copper diffusion-preventing layer 54 is selectively formed by an electroless metal plating method in a manner to surround the copper wiring layer 53, followed by etching the third metal diffusion-preventing layer 52 so as to form the source/drain electrodes.

A p-type TFT of a MOS structure including the gate electrode 49 and the source/drain electrodes 55 formed by using the copper wiring of the present invention can be obtained by the process described above. Incidentally, in the example described above, the wiring was formed by the method according to the third embodiment of the present invention. However, it is also possible to employ the method according to the first or second embodiment of the present invention for forming the wiring included in the example described above.

Figure 12:
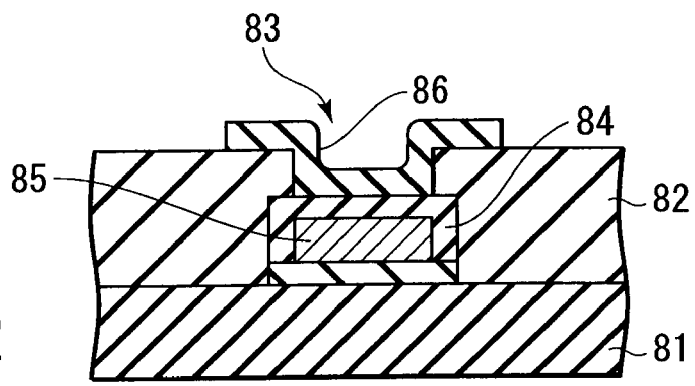
FIG. 12 is a cross sectional view showing the construction of a wiring having an ITO film formed therein.

After formation of the source/drain electrodes, an passivation interlayer insulator film 82 such as a silicon nitride layer is formed, followed by forming a contact hole 83 for the connection to the pixel electrode in the passivation interlayer insulator film 82 so as to expose the surface of the second metal diffusion-preventing layer 84, as shown in FIG. 12. Then, a transparent conductor layer (transparent pixel electrode) 86 such as an ITO (indium-tin oxide) layer or a tin oxide layer is formed by, for example, a sputtering method, followed by patterning the transparent conductor layer 86 so as to form an array substrate used in, for example, transmissive liquid crystal display devices. In this case, it is desirable to form simultaneously the transparent conductor layer 86 also above the copper wiring layer 85 covered with the second metal diffusion-preventing layer 84 in the display device and the external connecting terminal part so as to allow the transparent conductor layer 86 to perform the function of the protective film of the copper wiring layer 85 and the second metal diffusion-preventing layer 84, as shown in FIG. 12. Incidentally, the copper wiring layer 85 is of a single layer structure in FIG. 12. However, it is also possible for the copper wiring layer 85 to be of a two-layer structure consisting of a scanning line and a data line.

Also, it is possible to form a film of a reflective metal such as aluminum (Al) or silver (Ag) used in, for example, the reflective LCDs in place of the transparent film such as an ITO film.

Incidentally, the wiring and the electrode of the present invention, which can be used in LCDs as described above, can also be used easily for forming the data line, the power supply line, and the scanning line formed on the substrate of ELDs, e.g., an active matrix type organic ELD, for forming the electrode and the peripheral wiring included in a TFT, and for forming the wiring, etc. within the peripheral driver circuit formed on the same substrate.

According to the method of the present invention for forming the wiring and the electrode, it is possible to form a metal wiring surrounded by a metal diffusion-preventing layer and made of a low resistivity material of a high reliability. It is also possible to form selectively the metal wiring on the substrate without employing a CMP method, though the CMP method is required in the conventional damascene process. Further, it is possible to form the metal wiring made of a low resistivity material such as copper on a substrate having a large surface area, though it is difficult to apply the CMP process to a large substrate. Still further, the wiring can be formed selectively on a substrate without employing the CMP process so as to suppress the removal and disposal of the wiring material, with the result that the resources of the wiring material can be saved.

Incidentally, each of the embodiments described above is directed to the case where the second copper diffusion-preventing layer is utilized as a mask (protective layer) in order to prevent the surface of the copper wiring layer formed on the first copper diffusion-preventing layer from being damaged in the etching step of the first copper diffusion-preventing layer. However, the order of the manufacturing process steps is not limited to that in the embodiments described above. To be more specific, in the case of employing the etching method that does not damage the copper wiring layer in the etching step for removing the first copper diffusion-preventing layer (i.e., a wet etching or a dry etching), it is unnecessary to allow the second copper diffusion-preventing layer to perform the function of a mask. It follows that it is possible to employ the manufacturing method in which the second copper diffusion-preventing layer is formed after the etching process of the first copper diffusion-preventing layer.

Figure 13A:
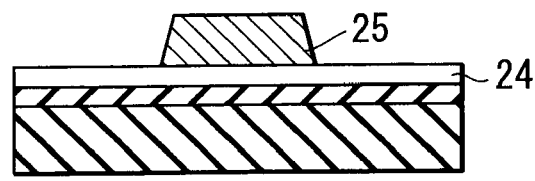
FIGS. 13A, 13B and 13C are cross sectional views collectively showing a first modification of the method of forming a wiring of the present invention.
Figure 13B:
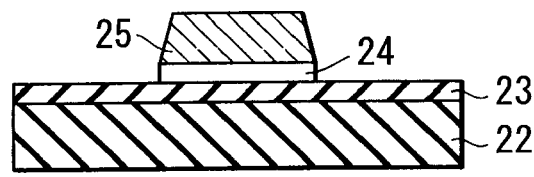
Figure 13C:
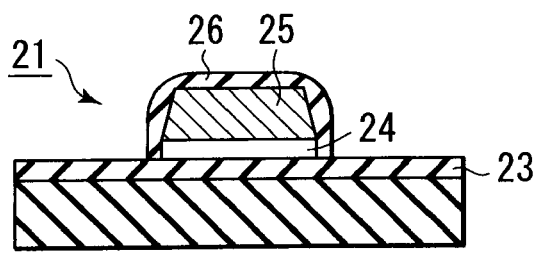
Figure 14:
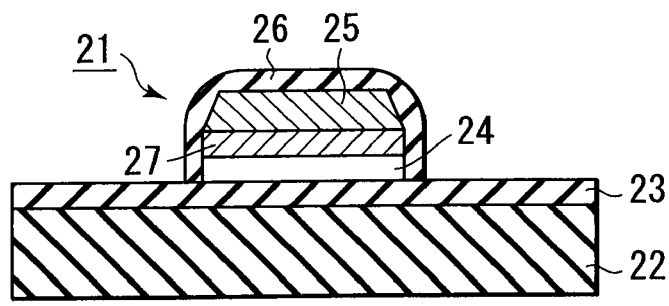
FIG. 14 is a cross sectional view showing the construction of the wiring formed by a method according to a second modification of the method of forming a wring of the present invention.

To be more specific, the copper wiring layer 25 is formed on the first copper diffusion-preventing layer 24 as shown in FIG. 13A after the process step shown in FIG. 7D, followed by applying an etching process, which does not damage the copper wiring layer 25, so as to remove that portion of the first copper diffusion-preventing layer 24 which is not positioned in the region in contact with the copper wiring layer 25 as shown in FIG. 13B. Further, the second copper diffusion-preventing layer 26 is formed in a manner to cover the first copper diffusion-preventing layer 24 and the copper wiring layer 25, as shown in FIG. 13C. It is also possible to employ the manufacturing process in which the copper wiring is formed and, then, etched in a manner to allow the photoresist layer to be left unremoved in a desired region alone in place of forming the copper wiring in the mask opening portion of the photoresist layer. A seed layer is not used in a first modification shown in FIG. 13C. On the other hand, a seed layer 27 is formed between the first copper diffusion-preventing layer 24 and the copper wiring layer 25 in a second modification shown in FIG. 14.

In the construction shown in FIG. 2 referred to previously, copper (Cu) is used for forming the seed layer 27. Alternatively, it is also possible to use cobalt (Co) or nickel (Ni) for forming the seed layer 27.

The technology for forming the wiring employed in each of the first and second embodiments described previously can be applied easily to the formation of the electrode and the display device.

It is possible to apply the wiring structure including the metal seed layer to display devices such as active matrix type LCDs. Of course, the particular wiring structure can also be applied to the wiring used in inorganic ELDs and organic ELDs. An example of the LCD is substantially equal to the equivalent circuit shown in FIG. 9 and, thus, the description thereof is omitted herein. The particular wiring structure can be applied to a plurality of data lines and a plurality of scanning lines formed on an array substrate and to the gate electrode, the source/drain electrodes, etc. included in each of a large number of TFTs arranged to form a matrix.

A second application of the wiring structure of the present invention to a polysilicon TFT will now be described. FIGS. 15A to 15G are cross sectional views collectively showing how to manufacture a p-type TFT of a MOS structure in which the metal (copper) wiring layer of the present invention is used for forming the source/drain electrodes.

Figure 15A:
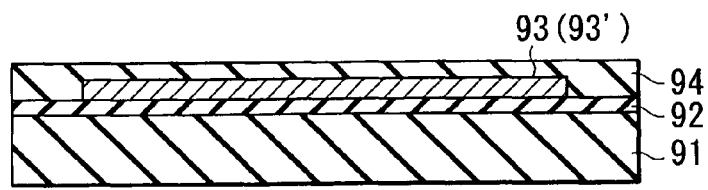
FIGS. 15A to 15G are cross sectional views collectively showing a method of forming a p-type TFT of the MOS structure, which provides an example to which the wiring structure of the present invention can be applied.

In the process step shown in FIG. 15A, an underlying insulator layer 92 is deposited first on a substrate 91, followed by forming an amorphous silicon layer 93' forming an active layer on the underlying insulator layer 92. Then, an annealing process is applied under an atmosphere of 500° C. so as to release hydrogen contained in the amorphous silicon layer 93'.

Further, the amorphous silicon layer 93' is crystallized into a polysilicon layer 93 by an ELA (Excimer Laser Anneal) method. Also, a mask (not shown) made of photoresist is formed by PEP, followed by processing the polysilicon layer 93 in the shape of an island by a CDE (Chemical Dry Etching) method. Further, a gate insulator layer 94 is deposited on the entire surface by a PE-CVD method.

Figure 15B:
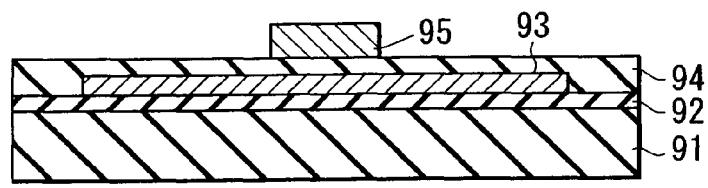

In the process step shown in FIG. 15B, a gate electrode layer 95, for example MoW, is formed on the entire surface of the gate insulator layer 94, followed by forming a mask (not shown) made of photoresist by PEP. Then, the gate insulator film 94 exposed to the outside through the mask is etched so as to form a gate electrode 95. Incidentally, it is possible for the gate electrode 95 to be made of copper and for a copper diffusion-preventing layer (barrier layer) and a Cu seed layer to be formed below the copper electrode.

Figure 15C:
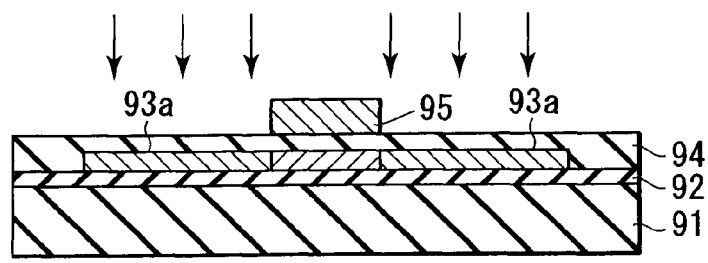

In the process step shown in FIG. 15C, boron is introduced into the polysilicon layer 93 by an ion implantation method with the gate electrode 95 used as a mask so as to form impurity regions (source/drain regions) 93a, followed by activating the implanted boron impurity.

Figure 15D:
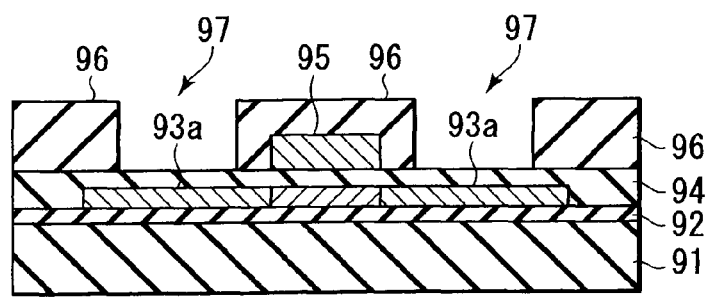

In the process step shown in FIG. 15D, an interlayer insulator film 96 is formed on the entire surface by a PE-CVD method, followed by forming a mask (not shown) made of photoresist on the interlayer insulator film 96 by PEP. Then, the exposed portion of the interlayer insulator film 96 is etched by using the photoresist mask so as to form contact holes 97 in the interlayer insulator film 96 in a manner to extend to reach the source and drain regions 93a.

Figure 15E:
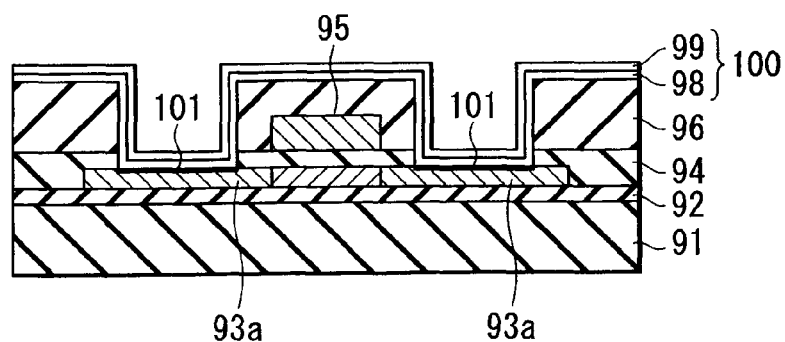

In the process step shown in FIG. 15E, a Co layer 98 is formed by a sputtering method in a thickness of 20 nm and a Co—B layer 99 is formed on the Co layer 98 by an electroless metal plating method in a thickness of 50 nm. The multilayered structure consisting of the Co layer 98 and the Co—B layer 99 thus formed acts as a first copper diffusion-preventing layer 100.

Figure 15F:
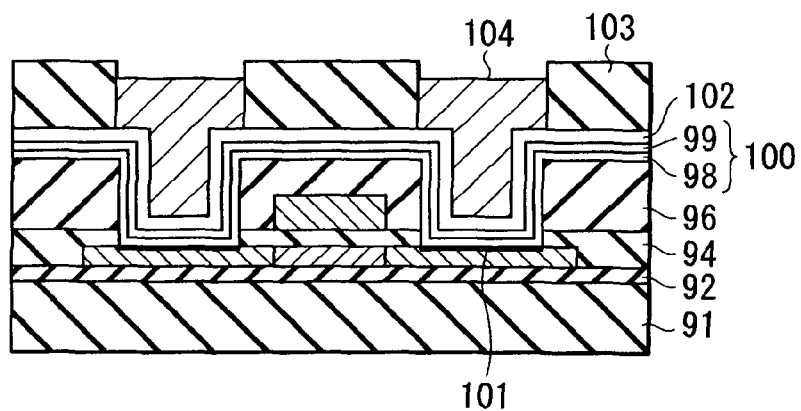

In the process step shown in FIG. 15F, a Cu seed layer 102 is formed on the entire surface in a thickness of 50 nm, followed by forming a mask 103 made of photoresist by PEP. Then, a copper wiring layer 104 is selectively formed in a thickness of 500 nm by an electroless metal plating method or an electrolytic metal plating method in the open portion of the mask 103.

Figure 15G:
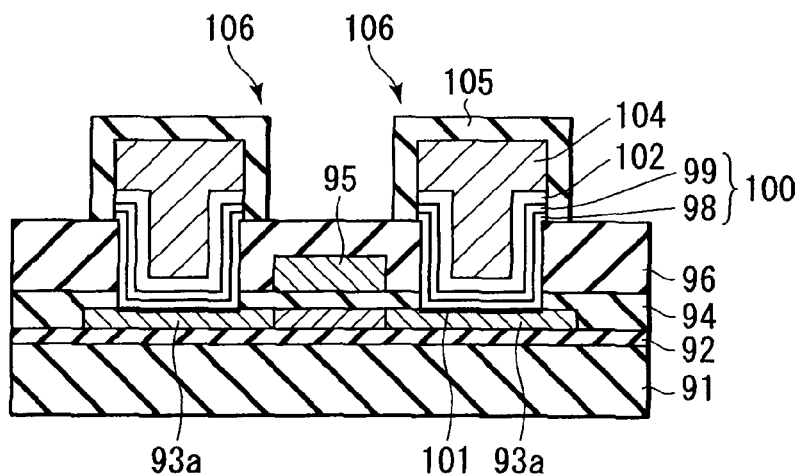

Further, in the process step shown in FIG. 15G, the mask 103 is removed, followed by etching the Cu seed layer 102 and the first copper diffusion-preventing layer 100 consisting of the Co layer 98 and the Co—B layer 99 with the copper wiring layer 104 used as a mask. Further, a second copper diffusion-preventing layer 105 consisting of, for example, Co—B or Co—W—B is formed by an electroless metal plating method in a manner to cover the entire exposed side surfaces of the Cu seed layer 102, the copper wiring layer 104 and the first copper diffusion-preventing layer 100, thereby forming source/drain electrodes 106. Still further, a heat treatment is applied so as to form cobalt silicide layers 101 at the boundaries between the Co layer 98 and the source region 93a and between the Co layer 98 and the drain region 93a so as to lower the resistance of the source/drain regions 93a and to enhance the capability of preventing the copper diffusion.

It should be noted that, in the process steps described above, the Cu seed layer 102 was formed on the Co—B layer 99, followed by forming the copper wiring layer 104 on the Cu seed layer 102 by using a mask made of photoresist. However, it is also possible to form the copper wiring layer 104 directly on the Co—B layer 99 by using a mask made of photoresist. It is also possible to etch the first copper diffusion-preventing layer 100 consisting of the Co layer 98 and the Co—B layer 99 with the copper wiring layer 104 used as a mask, followed by forming the second copper diffusion-preventing layer 105 made of, for example, Co—B in a manner to cover the entire exposed side surfaces of the copper wiring layer 47 and the first copper diffusion-preventing layer 100.

It is also possible to use a Ni layer and a Ni—B layer in place of the Co layer 98 and the Co—B layer 99 referred to above. Further, it is possible to use a Ni alloy such as Ni—B for forming the second copper diffusion-preventing layer 105. In the case of using a Ni layer in a part of the first copper diffusion-preventing layer 100, a nickel silicide layer is formed as a result of the heat treatment. Furthermore it is also possible to use a tantalum silicide layer and a titanium silicide layer in place of a cobalt silicide layer or a nickel silicide layer. Instead of the nickel silicide layer, a Ta silicide layer, a Ti silicide layer or the like may be formed.

Alternatively, it is possible to form an interlayer insulator film (not shown) made of, for example, silicon nitride or benzocyclobutene polymer after formation of the source/drain electrodes 106. In this case, a contact hole is formed in the interlayer insulator film for the connection to the pixel electrode so as to expose the second metal diffusion-preventing layer to the outside. Further, a transparent conductor layer made of, for example, ITO (indium/tin oxide) or tin oxide is formed by, for example, a sputtering method, followed by patterning the transparent conductor layer so as to obtain an array substrate for transmissive type LCDs.

As described above in detail, the present invention provides a wiring, an electrode, a display device and the manufacturing method thereof, which make it possible to form a metal wiring and an electrode made of a material having a low resistivity and surrounded by a metal diffusion-preventing layer on a substrate having a large surface area, to eliminate the waste of the wiring material in forming the wiring, and to lower the manufacturing cost by decreasing the number of manufacturing process steps.

What is claimed is:

1. An active matrix type display comprising:
    a flat glass substrate;
    a plurality of scanning lines;
    a plurality of signal lines; and
    thin film transistors arranged to form a matrix, wherein each of the scanning lines includes:
    a silicon nitride layer provided on the glass substrate;
    a first copper diffusion-preventing layer provided on the silicon nitride layer;
    a copper seed layer provided on the first copper diffusion-preventing layer, side and top surfaces thereof being exposed from the first copper diffusion-preventing layer;
    a copper layer plated on the top surface of the copper seed layer, the copper layer having a tapered cross section and side and top surfaces thereof being exposed from the first copper diffusion-preventing layer; and
    a second copper diffusion preventing layer covering the side surfaces of the copper seed layer and the copper layer, and the top surface of the copper layer, side walls of the second copper diffusion preventing layer that cover the side surfaces not extending laterally outwards from the copper layer on the flat glass substrate.

2. The active matrix type display according to claim 1, wherein the copper layer is formed by an electroless plating method.

3. The active matrix type display according to claim 1, wherein the copper layer is formed by an electroplating method.

4. The active matrix type display according to claim 1, wherein the copper layer comprises an alloy containing copper.

5. The active matrix type display according to claim 1, wherein the first and second copper diffusion preventing layers have a single layer structure formed of a Ta layer, a TaN layer, a TiN layer, a TaSiN layer, a WSiN layer, a Mo layer, or a Co alloy, or a multilayered structure of Ta/TaN/Ta, TiN/Ti, Co—B/Co, or Ni—B/Ni.

6. The active matrix type display according to claim 1, wherein the first and second copper diffusion preventing layers are formed surrounding the copper seed layer and the copper layer by an electroless plating method.

7. The active matrix type display according to claim 1, wherein the copper seed layer is formed by an electroless plating method.

8. The active matrix type display according to claim 1, wherein the thin film transistors are amorphous silicon thin film transistors.

9. The active matrix type display according to claim 1, wherein the thin film transistors are polycrystalline silicon thin film transistors.

10. The active matrix type display according to claim 1, wherein the thin film transistors are provided on a crystallized island-shaped silicon layer.

11. The active matrix type display according to claim 1, wherein a source electrode and a drain electrode of the thin film transistors comprise a copper layer having a tapered cross section on the top surface of the copper seed layer.

* * * * *